(12) United States Patent
Park et al.

(10) Patent No.: US 10,629,807 B2
(45) Date of Patent: Apr. 21, 2020

(54) PROCESS CONTROL METHOD AND PROCESS CONTROL SYSTEM FOR MANUFACTURING SEMICONDUCTOR DEVICE

(71) Applicant: Samsung Electronics Co., Ltd., Suwon-si, Gyeonggi-do (KR)

(72) Inventors: Jeong-Heon Park, Hwaseong-si (KR); Yong Sung Park, Suwon-si (KR); Joonmyoung Lee, Anyang-si (KR); Hyun Cho, Changwon-si (KR); Se Chung Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/107,242

(22) Filed: Aug. 21, 2018

(65) Prior Publication Data

US 2019/0115527 A1 Apr. 18, 2019

(30) Foreign Application Priority Data

Oct. 16, 2017 (KR) .................. 10-2017-0134231

(51) Int. Cl.
| | |
|---|---|
| H01L 21/00 | (2006.01) |
| H01L 43/12 | (2006.01) |
| H01L 43/02 | (2006.01) |
| G11C 11/15 | (2006.01) |
| G11C 11/16 | (2006.01) |

(52) U.S. Cl.
CPC .............. *H01L 43/12* (2013.01); *G11C 11/15* (2013.01); *G11C 11/16* (2013.01); *H01L 43/02* (2013.01); *G11C 11/161* (2013.01)

(58) Field of Classification Search
CPC ......... H01L 43/12; H01L 43/02; G11C 11/15; G11C 11/16; G11C 11/11
USPC ............................................................ 438/5
See application file for complete search history.

(56) References Cited

U.S. PATENT DOCUMENTS

| | | |
|---|---|---|
| 6,604,012 B1 | 8/2003 | Cho et al. |
| 6,625,512 B1 | 9/2003 | Goodwin |
| 7,165,197 B2 | 1/2007 | Park et al. |
| 9,753,849 B2 | 9/2017 | Mun et al. |

(Continued)

FOREIGN PATENT DOCUMENTS

| | | |
|---|---|---|
| KR | 10-1998-0005976 | 3/1998 |
| KR | 10-2000-0020700 | 4/2000 |
| KR | 10-0724186 | 5/2007 |

*Primary Examiner* — David S Blum
(74) *Attorney, Agent, or Firm* — Myers Bigel, P.A.

(57) ABSTRACT

Provided are process control methods and process control systems. The method includes performing a deposition process on a lot defined by a group of a plurality of wafers, performing a measurement process on the lot to obtain a measured value with respect to at least one wafer among the plurality of wafers, producing a target value of a factor of a process condition in the deposition process by using a difference between the measured value and a reference value, and providing an input value of the factor with respect to a subsequent lot based on the target value. The operation of providing the input value of the factor includes obtaining a previous target value of the factor previously produced with respect to at least one previous lot, and providing a weighted average of the previous target value and the target value as the input value.

14 Claims, 5 Drawing Sheets

(56) References Cited

U.S. PATENT DOCUMENTS

2004/0040001 A1\* 2/2004 Miller ................... H01L 22/20
 438/10
2010/0036518 A1\* 2/2010 Funk ..................... H01L 22/12
 700/121

\* cited by examiner

PROCESS CONTROL METHOD AND PROCESS CONTROL SYSTEM FOR MANUFACTURING SEMICONDUCTOR DEVICE

CROSS-REFERENCE TO RELATED APPLICATIONS

This U.S. non-provisional patent application claims priority under 35 U.S.C. § 119 from Korean Patent Application No. 10-2017-0134231 filed on Oct. 16, 2017, the entire contents of which are hereby incorporated by reference.

BACKGROUND

Inventive concepts relate to a process control method and a process control system for manufacturing a semiconductor device, and more particularly, to a deposition process control method and a deposition process control system for forming thin films.

As electronic products trend toward high speed and/or low power consumption, high speed and low operating voltages can be increasingly required for semiconductor memory devices incorporated in the electronic products. Next generation semiconductor memory devices, for example, MRAM (Magnetic Random Access Memory) and PRAM (Phase Change Random Access Memory), have been developed to meet demand for high performance and low power of the semiconductor memory devices. These and other next generation semiconductor memory devices may include a material having characteristics such that their resistance becomes different depending on applied electric current or voltage, and their resistance is maintained even if their electrical current or voltage supply is interrupted. In this case, electrical/magnetic characteristics of the devices may be affected by a deposition process for forming a thin layer including a material constituting the devices. An advance process control (APC) system may be used to improve process capability of a semiconductor manufacturing process.

SUMMARY

Some embodiments of inventive concepts provide a process control method and a process control system to allow mass production of semiconductor devices.

Some embodiments of inventive concepts provide a process control method and a process control system to manufacture semiconductor devices having desired or required characteristics.

According to example embodiments of inventive concepts, a process control method for manufacturing a semiconductor device may comprise: performing a first deposition process on a lot defined by a group of a plurality of wafers; performing a measurement process on the lot to obtain a measured value with respect to at least one wafer among the plurality of wafers; producing a target value of a factor of a process condition in the first deposition process by using a difference between the measured value and a reference value; and providing an input value of the factor with respect to a second deposition process for a subsequent lot based on the target value. The operation of providing the input value of the factor may comprise: obtaining a previous target value of the factor, the previous target value being previously produced with respect to at least one previous lot; and providing a weighted average of the previous target value and the target value as the input value.

According to example embodiments of inventive concepts, a process control method for manufacturing a semiconductor device may comprise: performing a first deposition process on a lot defined by a group of a plurality of wafers, the deposition process being performed to form a magnetic tunnel junction layer on each of the plurality of wafers; performing a measurement process on the lot, the measurement process being performed to obtain a measured value relating to characteristics of the magnetic tunnel junction layer formed on at least one wafer among the plurality of wafers; producing a target value of a factor of a process condition in the first deposition process by using a difference between the measured value and a reference value relating to the characteristics of the magnetic tunnel junction layer; providing an input value of the factor based on the target value to change the process condition in the deposition process; and performing a second deposition process on a subsequent lot based on the changed process condition.

According to example embodiments of inventive concepts, a process control system for manufacturing a semiconductor device may comprise: a process operation section or stage performing a deposition process on a lot defined by a group of a plurality of wafers, the deposition process being performed to form a magnetic tunnel junction layer on each of the plurality of wafers; a measurement section or operation stage measuring characteristics of the magnetic tunnel junction layer formed on at least one wafer among the plurality of wafers; and a control operation section or stage changing a process condition in the deposition process by using a difference between a pre-stored reference value and a measured value measured by the measurement operation section or stage. The control operation section or stage may be configured to obtain an output value of a factor of the process condition from the process operation section or stage, to obtain the measured value from the measurement operation section or stage, to produce a target value of the factor by correcting the output value using the difference between the measured value and the reference value, and to provide the process operation section or stage with an input value of the factor, the input value being determined based on the target value.

DETAILED DESCRIPTION OF EMBODIMENTS

It will be hereinafter described example embodiments of inventive concepts in conjunction with the accompanying drawings.

Figure 1:
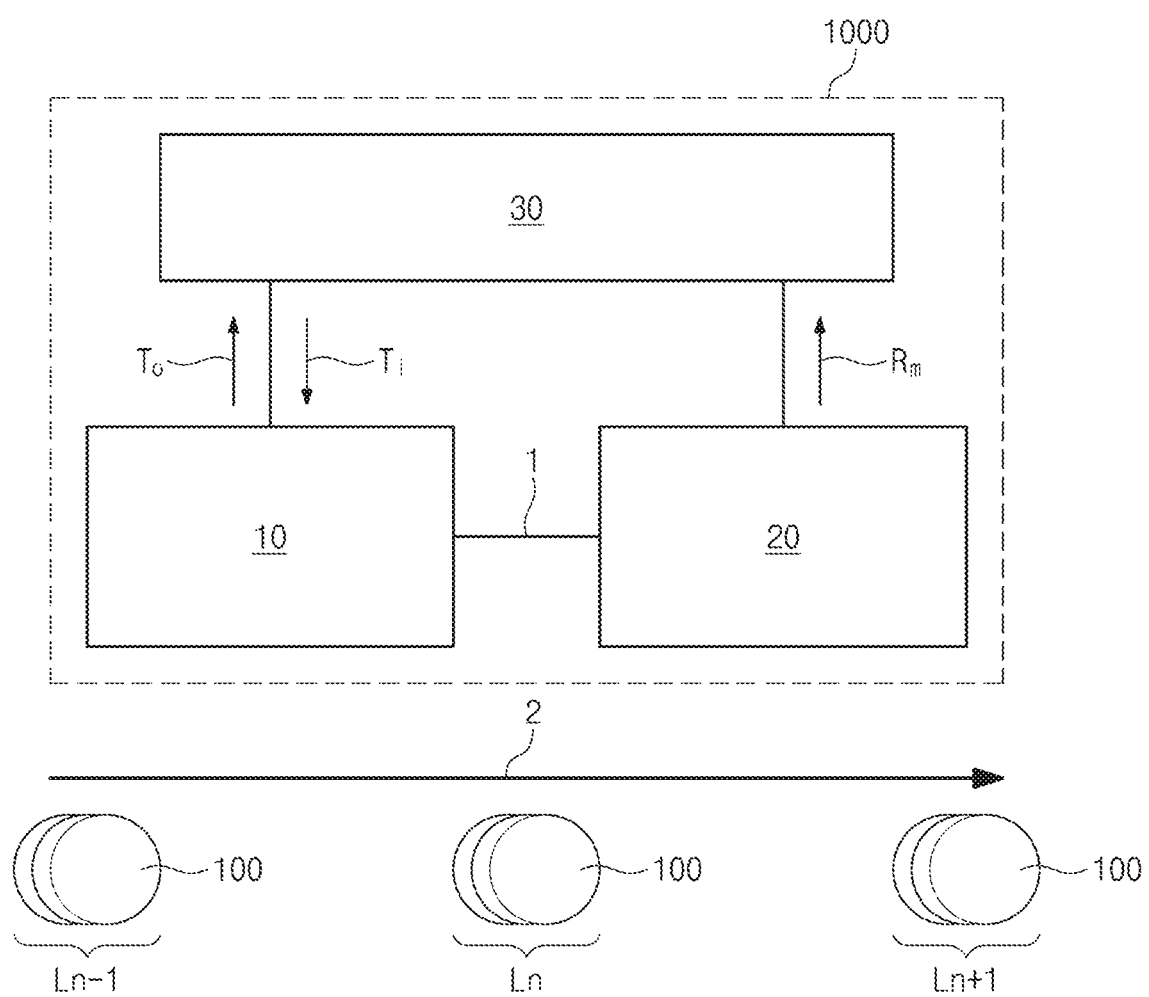
FIG. 1 is a simplified schematic diagram illustrating a process control system for manufacturing a semiconductor device according to example embodiments of inventive concepts.

FIG. 1 is a simplified schematic diagram illustrating a process control system for manufacturing a semiconductor device according to example embodiments of inventive concepts.

Referring to FIG. 1, a process control system 1000 may include a process operation section or stage 10 that performs a unit process for manufacturing a semiconductor device on an object, a measurement operation section or stage 20 that produces data measured from the object, and a control operation section or stage 30 that stores and processes data obtained from the process section 10 and the measurement section 20. The measurement section 20 may be configured in such a way that a non-destructive test is available to measure the data from the object. The process section 10, the measurement section 20, and the control section 30 may be connected to each other through an interface 1, and the interface 1 may include a wired element, a wireless element, a universal serial bus port, or the like. The data obtained from the process section 10 and the measurement section 20 may be transmitted through the interface 1 to the control section 30, and data processed in the control section 30 may be fed-back through the interface 1 to the process section 10.

The object may be or include a lot defined by a group of a plurality of wafers 100, such as semiconductor wafers. FIG. 1 shows a line 2 representing flow of a plurality of lots Ln−1, Ln, and Ln+1. The plurality of lots Ln−1, Ln, and Ln+1 may sequentially pass through the process control system 1000 along the line 2. Each of the plurality of lots Ln−1, Ln, and Ln+1 may pass through the process section 10 and the measurement section 20 in sequence.

It will be hereinafter explained a process control method using the process control system 1000.

Figure 2:
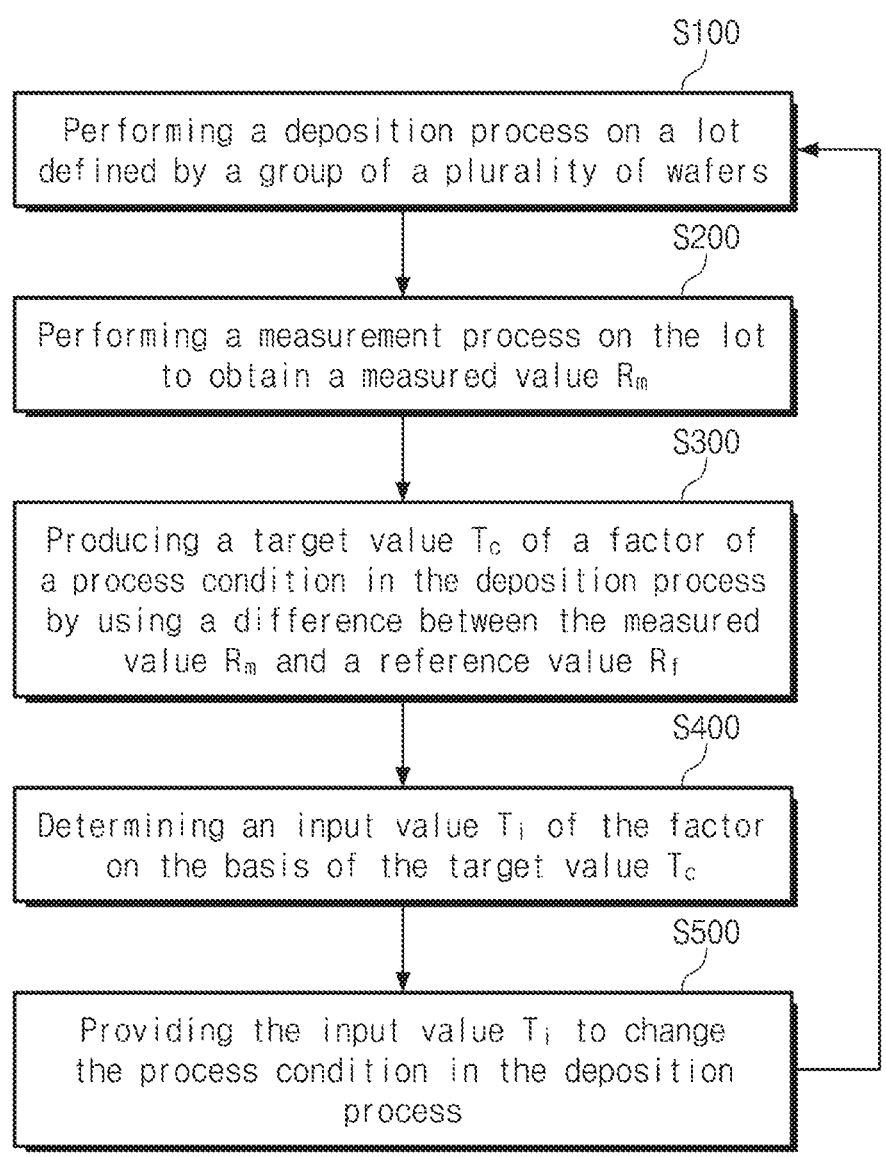
FIG. 2 is a flow chart illustrating a process control method for manufacturing a semiconductor device according to example embodiments of inventive concepts.
Figure 3:
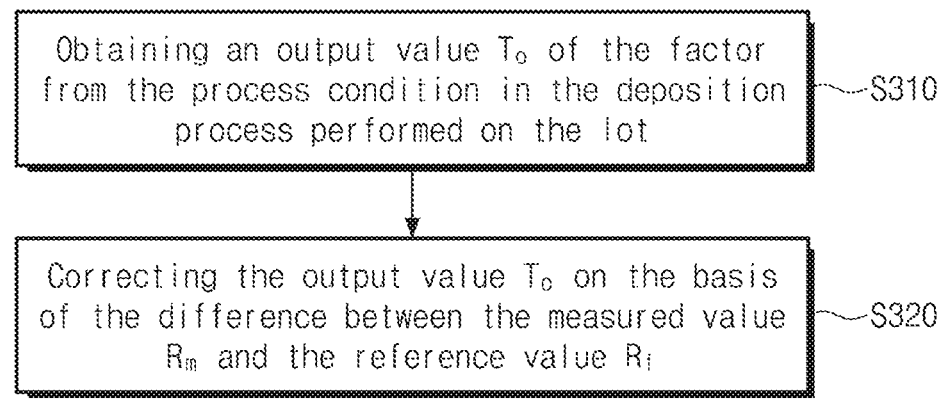
FIG. 3 is a flow chart illustrating an operation S300 of FIG. 2.
Figure 4:
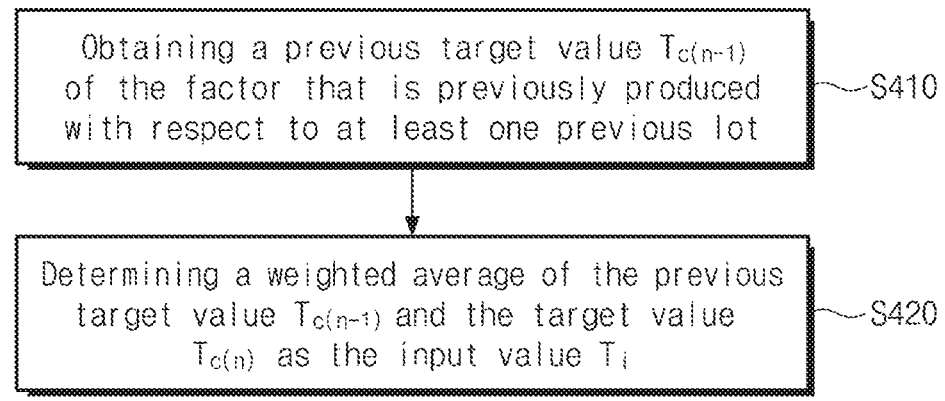
FIG. 4 is a flow chart illustrating an operation S400 of FIG. 2.
Figure 5:
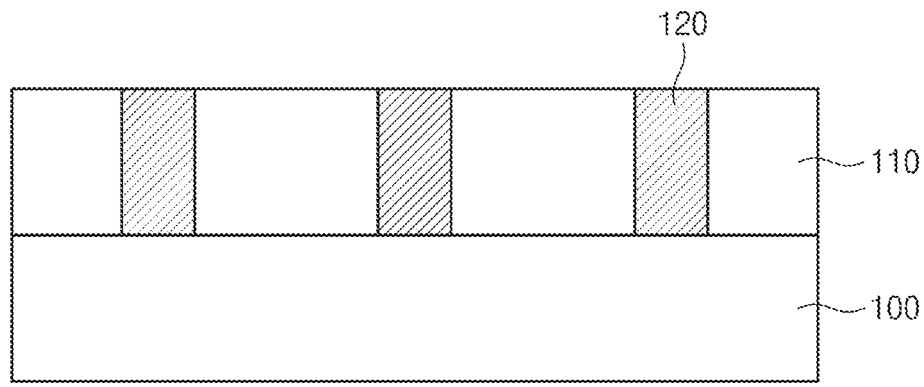
FIGS. 5 and 6 are cross-sectional views illustrating an operation S100 of FIG. 2.
Figure 6:
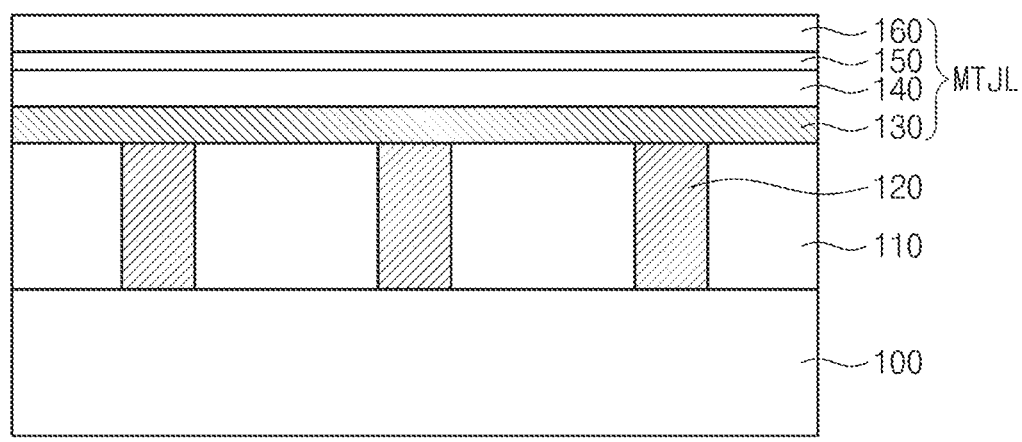
Figure 7:
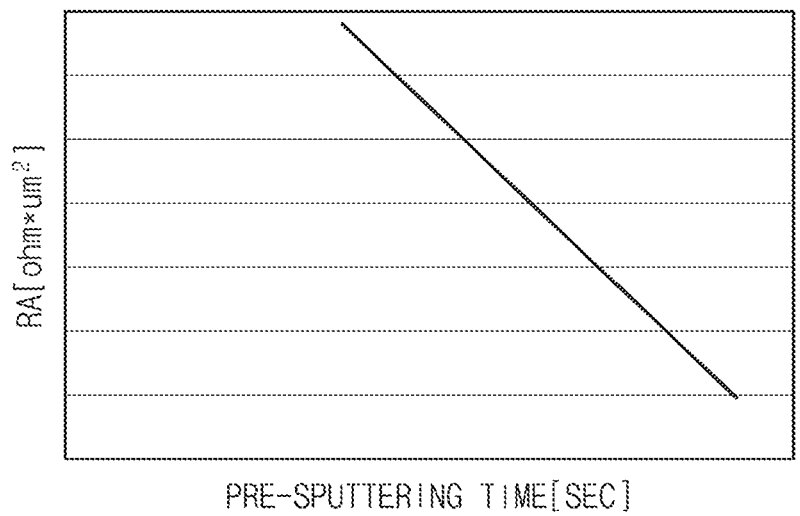
FIG. 7 is a graph illustrating an operation S300 of FIG. 2.

FIG. 2 is a flow chart illustrating a process control method for manufacturing a semiconductor device according to example embodiments of inventive concepts. FIG. 3 is a flow chart illustrating an operation S300 of FIG. 2, and FIG. 4 is a flow chart illustrating an operation S400 of FIG. 2. FIGS. 5 and 6 are cross-sectional views illustrating an operation S100 of FIG. 2, and FIG. 7 is a graph illustrating an operation S300 of FIG. 2.

Referring to FIGS. 1 and 2, the process section 10 may be provided with the lot Ln defined by the group of the plurality of wafers 100, and a deposition process may be performed on the lot Ln (S100). The deposition process may be performed to form a thin layer on each of the plurality of wafers 100. For example, the deposition process may be carried out to form a magnetic tunnel junction layer on each of the plurality of wafers 100.

In detail, referring to FIGS. 1 and 5, each of the plurality of wafers 100 may include thereon an interlayer dielectric layer 110 and bottom electrode contacts 120. The interlayer dielectric layer 110 and the bottom electrode contacts 120 may be formed prior to providing the lot Ln into the process section 10.

Referring to FIGS. 1 and 6, the lot Ln may be provided into the process section 10, and the deposition process may be performed on the lot Ln. As a result, a magnetic tunnel junction layer MTJL may be formed on the interlayer dielectric layer 110 of each of the plurality of wafers 100. The magnetic tunnel junction layer MTJL may include a bottom electrode layer 130, a first magnetic layer 140, a tunnel barrier layer 150, and a second magnetic layer 160 that are sequentially stacked on the interlayer dielectric layer 110. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts. The bottom electrode layer 130 may include conductive metal nitride (e.g., titanium nitride or tantalum nitride), and the tunnel barrier layer 150 may include metal oxide (e.g., magnesium oxide). Each of the first and second magnetic layers 140 and 160 may include at least one ferromagnetic element. The deposition process may include a plurality of sub-deposition processes for respectively forming the bottom electrode layer 130, the first magnetic layer 140, the tunnel barrier layer 150, and the second magnetic layer 160.

Referring back to FIGS. 1 and 2, the deposition process may be performed under a preset process condition, and the process condition may include a plurality of factors. The process condition may alter when the plurality of factors are adjusted in their input values. For example, the deposition process may include a sputtering deposition process that is performed using at least one target. In this case, the factors of the process condition may include a pre-sputtering time, a deposition time, an ion incident angle, an ion energy, an ion current, and the like. In this description, the pre-sputtering time may be an amount of time required for removing particles either from a chamber where the sputtering deposition is performed or from the at least one target, and the deposition time may be an amount of time required for sputtering to form at least one thin layer. When the deposition process includes the plurality of sub-deposition processes, at least one of the plurality of sub-deposition processes may be the sputtering deposition process.

After passing through the process section 10, the lot Ln may be provided into the measurement section 20. A measurement process may be performed on the lot Ln to obtain a measured value Rm from the lot Ln (S200). The measurement process may be performed using a tool employed for a non-destructive test. The measurement process may be performed to measure characteristics of a thin layer formed on at least one of the plurality of wafers 100. The measured value Rm may relate to characteristics of the thin layer formed on at least one of the plurality of wafers 100. For example, the measurement process may be performed to measure characteristics of the magnetic tunnel junction layer MTJL formed on at least one of the plurality of wafers 100. In this case, the measured value Rm may relate to electrical or magnetic characteristics of the thin layer formed on at least one of the plurality of wafers 100. For example, the measurement section 20 may be configured to measure resistance (RA), magnetoresistance ratio (TMR), coercivity (Hc), exchange magnetic field (Hex), and/or perpendicular magnetic anisotropy (PMA) of the magnetic tunnel junction layer MTJL, and the measured value Rm may relate to resistance (RA), magnetoresistance ratio (TMR), coercivity (Hc), exchange magnetic field (Hex), and/or perpendicular magnetic anisotropy (PMA), respectively, of the magnetic tunnel junction layer MTJL. The term "and/or" includes any and all combinations of one or more of the associated listed items. The control section 30 may receive the measured value Rm obtained from the lot Ln.

The control section 30 may compare the measured value Rm with a reference value Rf stored in advance, and produce a target value Tc of one factor of the process condition in the deposition process using a difference between the measured value Rm and the reference value Rf(S300). The reference value Rf may be a desired value relating to characteristics of a thin layer formed by the deposition process. For example, the reference value Rf may be a desired value relating to electrical or magnetic characteristics of the magnetic tunnel junction layer MTJL. In this case, the measured value Rm and the reference value Rf may relate to one of resistance (RA), magnetoresistance ratio (TMR), coercivity (Hc), exchange magnetic field (Hex), or perpendicular magnetic anisotropy (PMA) of the magnetic tunnel junction layer MTJL.

Characteristics of a thin layer formed by the deposition process may be dependent on at least one of the plurality of factors of the process condition in the deposition process. For example, when the deposition process includes a sputtering deposition process, the characteristics of the thin layer may be dependent on the pre-sputtering time, the deposition time, the ion incident angle, the ion energy, and/or the ion current. In this case, the control section 30 may use a difference between the measured value Rm and the reference value Rf to produce (or generate) the target value Tc with respect to a factor of the pre-sputtering time, the deposition time, the ion incident angle, the ion energy, or the ion current.

For example, referring to FIGS. 1 and 3, the control section 30 may obtain an output value To of the factor from the process condition of the deposition process performed on the lot Ln (S310). The deposition process may be performed under the process condition in which the factor has a specific value with respect to the lot Ln, and the output value To of the factor may correspond to the specific value of the factor.

Based on a difference between the measured value Rm and the reference value Rf, the control section 30 may correct the output value To of the factor (S320). The target value Tc of the factor may correspond to the corrected output value. The output value To may be corrected by Mathematical Equation 1 below.

$$Tc=To+(Rf-Rm)/\Delta R$$ [Mathematical Equation 1]

In Mathematical Equation 1, Rf may represent the reference value, Rm may represent the measured value, To may represent the output value of the factor, Tc may represent the target value of the factor, and $\Delta R$ may represent an amount of variation in characteristics of the thin layer per unit of the factor.

For example, when the deposition process is performed to form the magnetic tunnel junction layer MTJL, the deposition process may include a sub-deposition process that forms the tunnel barrier layer 150. The sub-deposition process may be or include a sputtering deposition process. In this case, the resistance (RA) of the magnetic tunnel junction layer MTJL may be dependent on a pre-sputtering time of the sub-deposition process that forms the tunnel barrier layer 150. For example, referring to FIG. 7, the longer the pre-sputtering time of the sub-deposition process that forms the tunnel barrier layer 150, the less the resistance (RA) of the magnetic tunnel junction layer MTJL. In this case, the measured value Rm and the reference value Rf may relate to the resistance (RA) of the magnetic tunnel junction layer MTJL, and the factor may be the pre-sputtering time of the sub-deposition process that forms the tunnel barrier layer 150. $\Delta R$ may be an amount of variation in resistance (RA) of the magnetic tunnel junction layer MTJL per unit of the pre-sputtering time. The output value To and the target value Tc may respectively be an output value and a target value of the pre-sputtering time of the sub-deposition process that forms the tunnel barrier layer 150.

Referring back to FIGS. 1 and 2, based on the target value Tc, the control section 30 may determine an input value Ti of the factor of the process condition in the deposition process (S400).

For example, referring to FIGS. 1 and 4, the control section 30 may obtain a previous target value that is previously produced for the factor with respect to at least one previous lot Ln−1 (S410). Hereinafter, the expression Tc(n−1) indicates the previous target value that is previously produced for the factor with respect to the at least one previous lot Ln−1, and the expression Tc(n) denotes the target value Tc that is produced with respect to the lot Ln. As discussed with reference to FIG. 1, the plurality of lots Ln−1, Ln, and Ln+1 may sequentially pass through the process control system 1000 along the line 2, and the operations of FIG. 2 may be repeatedly performed on each of the plurality of lots Ln−1, Ln, and Ln+1. Accordingly, in the operation S300 of FIG. 2 performed on the at least one previous lot Ln−1, the control section 30 may produce and store the previous target value Tc(n−1) of the factor.

The control section 30 may determine a weighted average of the previous target value Tc(n−1) and the target value Tc(n) as the input value Ti of the factor (S420). When the control section 30 produces a plurality of previous target values Tc(1), T(2), ..., Tc(n−1) from a plurality of previous lots L1, L2, ..., Ln−1, respectively, the input value Ti of the factor may be calculated by Mathematical Equation 2 below.

$$Ti=\Sigma(Tc(k)\times f(k))$$ [Mathematical Equation 2]

In Mathematical Equation 2, k is an integer from 1 to n, and $\Sigma f(k)$ is 1.

For example, the input value Ti of the factor may correspond to a weighted average of the plurality of previous target values Tc(1), T(2), ..., Tc(n−1) and the target value Tc(n). A weight for the target value Tc(n) may be greater than that for each of the plurality of previous target values Tc(1), Tc(2), ..., Tc(n−1), i.e., f1, f2, ..., f(k−1)<f(k).

Alternatively, the control section 30 may determine the target value Tc(n) of the factor that is produced with respect to the lot Ln as the input value Ti of the factor, i.e., Ti=Tc(n).

Referring back to FIGS. 1 and 2, the control section 30 may provide the process section 10 with the input value Ti of the factor, thereby changing the process condition of the deposition process (S500) for a subsequent lot Ln+1. The process condition may be changed without measurement of characteristics of layers formed on a sample wafer. The process section 10 may carry out the deposition process on a subsequent lot Ln+1 under the changed process condition, prior to initiating and without interrupting the deposition process for the subsequent lot Ln+1. The operations of FIG. 2 may be repeatedly performed on further subsequent lots Ln+2, Ln+3, . . . .

When manufacturing a semiconductor device including a magnetic tunnel junction, characteristics required for the magnetic tunnel junction may be affected by a deposition processes for a magnetic tunnel junction layer. The characteristics of the magnetic tunnel junction may be altered even when a slight change is provided to environment inside a chamber of deposition equipment used in the deposition process. In this case, it may be difficult to form the magnetic tunnel junction while maintaining its uniform characteristics with respect to the plurality of lots Ln−1, Ln, and Ln+1. It will be understood that "uniform" characteristics as described herein need not be identical, but rather, may allow for manufacturing variations within a predetermined deviation from a desired characteristic that is acceptable based on the product application.

According to embodiments of the inventive concepts, the control section 30 may be configured to determine the input value Ti of a factor of the process condition in the deposition process by utilizing a difference between the pre-stored reference value Rf and the measured value Rm obtained from the lot Ln, and to feedback the input value Ti to the process section 10 so as to change the process condition in the deposition process for the subsequent lot Ln+1. Therefore, it may be possible to uniformly maintain characteristics of a thin layer formed by the deposition process by adapting a subsequent deposition process on a lot Ln+1 based on the actual characteristics of the lot Ln of wafers produced by a current deposition process, without implementing changes to the current deposition process.

Furthermore, since the control section 30 is configured to use the measured value Rm of each lot so as to change the process condition in the deposition process for the subsequent lot, embodiments of the inventive concepts may not require or otherwise may not be based on measurements performed on a sample wafer in a separate sample process for uniformly maintaining characteristics of a thin layer formed by the deposition process. Accordingly, it may be possible to simplify process operations for manufacturing a semiconductor device.

As a result, it may be feasible to provide a process control method and a process control system for mass production of semiconductor devices having required or desired characteristics.

Embodiments are described, and illustrated in the drawings, in terms of functional sections, stages, and/or blocks. Those skilled in the art will appreciate that these sections, stages, and/or blocks are physically implemented by electronic (or optical) circuits such as logic circuits, discrete components, microprocessors, hard-wired circuits, memory elements, wiring connections, and the like. In the case of the sections, stages, and/or blocks being implemented by microprocessors or similar, they may be programmed using software (e.g., microcode) to perform various functions discussed herein and may optionally be driven by firmware and/or software. Alternatively, each section, stage, and/or block may be implemented by dedicated hardware, or as a combination of dedicated hardware to perform some functions and a processor (e.g., one or more programmed microprocessors and associated circuitry) to perform other functions.

The aforementioned description provides example embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

What is claimed is:

1. A process control method for manufacturing a semiconductor device, the process control method comprising:
   performing a first deposition process on a lot comprising a plurality of wafers;
   performing a measurement process on the lot to obtain a measured value with respect to at least one wafer among the plurality of wafers;
   producing a target value of a factor of a process condition in the first deposition process by using a difference between the measured value and a reference value; and
   providing an input value of the factor with respect to a second deposition process for a subsequent lot based on the target value,
   wherein providing the input value of the factor comprises:
      obtaining a previous target value of the factor, the previous target value being previously produced with respect to at least one previous lot; and
      providing a weighted average of the previous target value and the target value as the input value.

2. The process control method of claim 1, wherein producing the target value of the factor comprises:
   obtaining an output value of the factor from the process condition in the first deposition process performed on the lot; and
   correcting the output value based on the difference between the measured value and the reference value.

3. The process control method of claim 1, wherein performing the first deposition process comprises forming a magnetic tunnel junction layer on each of the plurality of wafers,
   wherein the measured value comprises electrical or magnetic characteristics of the magnetic tunnel junction layer formed on the at least one wafer among the plurality of wafers,
   wherein the reference value is a desired value with respect to the electrical or magnetic characteristics of the magnetic tunnel junction layer.

4. The process control method of claim 3, wherein
   the first deposition process comprises a sputtering deposition process, and
   the factor of the process condition comprises one of a pre-sputtering time, a deposition time, an ion incident angle, an ion energy, or an ion current.

5. The process control method of claim 3, wherein
   the magnetic tunnel junction layer comprises a tunnel barrier layer and magnetic layers separated from each other by the tunnel barrier layer,
   the first deposition process comprises a sub-deposition process that forms the tunnel barrier layer on each of the plurality of wafers, the sub-deposition process comprising a sputtering deposition process,
   the measured value and the reference value comprise resistance (RA) of the magnetic tunnel junction layer, and
   the factor of the process condition comprises a pre-sputtering time of the sub-deposition process.

6. The process control method of claim 5, wherein producing the target value of the factor comprises:
   obtaining an output value of the pre-sputtering time from a process condition in the sub-deposition process performed on the lot; and
   correcting the output value based on the difference between the measured value and the reference value to produce the target value of the pre-sputtering time.

7. The process control method of claim 6, wherein correcting the output value to produce the target value of the pre-sputtering time is based on:

$$Tc=To+(Rf-Rm)/\Delta R,$$

wherein, To represents the output value of the pre-sputtering time, Rf represents the reference value, Rm represents the measured value, ΔR represents a variation of resistance of the magnetic tunnel junction layer per unit of the pre-sputtering time, and Tc represents the target value of the pre-sputtering time.

8. A process control method for manufacturing a semiconductor device, the process control method comprising:
   performing a first deposition process on a lot comprising a plurality of wafers to form a magnetic tunnel junction layer on each of the plurality of wafers;
   performing a measurement process on the lot to obtain a measured value with respect to characteristics of the magnetic tunnel junction layer formed on at least one wafer among the plurality of wafers;
   producing a target value of a factor of a process condition in the first deposition process by using a difference between the measured value and a reference value with respect to the characteristics of the magnetic tunnel junction layer;

providing an input value of the factor based on the target value to change the process condition; and performing a second deposition process on a subsequent lot based on the process condition that was changed.

9. The process control method of claim 8, wherein producing the target value of the factor comprises:

obtaining an output value of the factor from the process condition in the first deposition process performed on the lot; and correcting the output value based on the difference between the measured value and the reference value.

10. The process control method of claim 9, wherein providing the input value to change the process condition comprises providing the target value as the input value, and wherein the process condition is not changed based on measurements performed on a sample wafer that is distinct from the plurality of wafers.

11. The process control method of claim 9, wherein providing the input value to change the process condition comprises:

obtaining a previous target value of the factor, the previous target value being previously produced with respect to at least one previous lot; and providing a weighted average of the previous target value and the target value as the input value.

12. The process control method of claim 8, wherein the first deposition process comprises a sputtering deposition process, and the factor of the process condition comprises one of a pre-sputtering time, a deposition time, an ion incident angle, an ion energy, or an ion current.

13. The process control method of claim 12, wherein producing the target value of the factor comprises:

obtaining an output value of the factor from the process condition in the first deposition process performed on the lot; and correcting the output value based on the difference between the measured value and the reference value, wherein correcting the output value is based on:

$$Tc = To + (Rf - Rm)/\Delta R,$$

wherein, To represents the output value of the factor, Rf represents the reference value, Rm represents the measured value, $\Delta R$ represents a variation of the characteristics of the magnetic tunnel junction layer per unit time of the factor, and Tc represents the target value of the factor.

14. The process control method of claim 8, wherein the measured value and the reference value correspond to the characteristics comprising one of resistance (RA), magnetoresistance ratio (TMR), exchange magnetic field (Hex), or perpendicular magnetic anisotropy (PMA) of the magnetic tunnel junction layer, and wherein the characteristics of the magnetic tunnel junction layer formed on the at least one wafer of the lot and of a magnetic tunnel junction layer formed on at least one wafer of the subsequent lot are uniform.

* * * * *